(12) United States Patent
Chang et al.

(10) Patent No.: US 6,774,410 B2
(45) Date of Patent: Aug. 10, 2004

(54) EPITAXIAL GROWTH OF NITRIDE SEMICONDUCTOR DEVICE

(75) Inventors: Chih-Sung Chang, Pingtung (TW); Tzong-Liang Tsai, Hsinchu (TW)

(73) Assignee: United Epitaxy Company, Hsinchu (TW)

( * ) Notice: Subject to any disclaimer, the term of this patent is extended or adjusted under 35 U.S.C. 154(b) by 0 days.

(21) Appl. No.: 10/292,712

(22) Filed: Nov. 13, 2002

(65) Prior Publication Data

US 2003/0071276 A1 Apr. 17, 2003

Related U.S. Application Data

(62) Division of application No. 09/659,015, filed on Sep. 8, 2000, now Pat. No. 6,504,183.

(51) Int. Cl.[7] .......................... H01L 29/06; H01L 33/00
(52) U.S. Cl. .......................... 257/190; 257/13; 257/97; 257/103; 372/43
(58) Field of Search .......................... 257/190, 13, 97, 257/103, 613, 615; 372/43

(56) References Cited

U.S. PATENT DOCUMENTS

| | | | | |
|---|---|---|---|---|
| 5,909,040 A | * | 6/1999 | Ohba et al. | 257/190 |
| 6,051,847 A | * | 4/2000 | Oku et al. | 257/94 |
| 6,555,846 B1 | * | 4/2003 | Watanabe et al. | 257/94 |
| 6,580,098 B1 | * | 6/2003 | Koide | 257/103 |
| 6,664,560 B2 | * | 12/2003 | Emerson et al. | 257/14 |

* cited by examiner

*Primary Examiner*—Jerome Jackson
*Assistant Examiner*—Joseph Nguyen
(74) *Attorney, Agent, or Firm*—Birch, Stewart, Kolasch & Birch, LLP

(57) ABSTRACT

The present invention provides a semiconductor device with reducing dislocation density. The semiconductor device includes multiple nucleuses between a substrate and an AlGaInN compound semiconductor. The dislocation density that is induced by crystal lattice differences between the substrate and the AlGaInN compound semiconductor is significantly reduced and the growth of the AlGaInN compound semiconductor is improved.

7 Claims, 11 Drawing Sheets

EPITAXIAL GROWTH OF NITRIDE SEMICONDUCTOR DEVICE

This application is a divisional of application Ser. No. 09/659,015, filed on Sep. 8, 2000, now U.S. Pat. No. 6,504,183 the entire contents of which are hereby incorporated by reference and for which priority is claimed under 35 U.S.C. § 120.

BACKGROUND OF THE INVENTION

1. Field of the Invention

The present invention relates to a semiconductor device, and more particularly, to a light emitting semiconductor device with reducing dislocation density of epitaxial growth.

2. Description of the Related Art

AlInGaN-based compound semiconductor materials are frequently applied to produce light emitting devices such as blue-green light emitting diodes and laser diodes. Theses materials are usually grown on aluminum oxide ($Al_2O_3$) or silicon carbide (SiC) substrates.

The semiconductor materials are difficult to directly grow on the substrates because of lattice constant differences. For example, a GaN crystal layer (a=3.189 Å) is hard to directly grow on an aluminum oxide substrate (a=4.758 Å) since the difference of their lattice constants exceeds 16%.

Akasaki et al., in U.S. Pat. No. 4,855,249, first disclosed to grow at a low temperature an amorphous AlN buffer layer on an $Al_2O_3$ substrate so as to reduce problems of the lattice constant differences between the $Al_2O_3$ substrate and a GaN layer. Nakamura et al., in U.S. Pat. No. 5,290,393, disclosed to use GaN or AlGaN as a buffer layer. An amorphous GaN buffer layer was first grown at a temperature between 400 and 900° C. on an $Al_2O_3$ substrate. A GaN epitaxy layer was then grown at a temperature between 1000 and 1200° C. on the GaN buffer layer. The quality and performance of the GaN epitaxy layer were better than those of a GaN epitaxy layer produced by using AlN as a buffer layer.

Conventionally, nucleuses with one single species are grown between a substrate and a buffer layer so as to balance the lattice constant differences. However, the single-species nucleuses on the substrate still exhibit more occurrence chances of dislocation defects. Please refer to FIGS. 1a to 1d in describing how the dislocation defects tend to occur according to prior art. In FIG. 1a, nucleuses 101 are grown on a substrate 1. Next, a buffer layer 103 is gradually grown on the substrate 1 and the nucleuses 101 as shown in FIG. 1b. After completion of the buffer layer 103, which is shown in FIG. 1c, dislocation defects 104 mostly occur along sides of two nucleuses 101. In FIG. 1d, after growing an epitaxy layer 105, the dislocation defects 104 further extend within the epitaxy layer 105. The dislocation defects 104 reduce both electronic and optical performance of a light emitting device.

There always exists a need to reduce the lattice constant differences between an epitaxy layer and a substrate, ex. between a GaN-based epitaxy layer and an aluminum oxide substrate, since the differences result in dislocation defects of the epitaxy layer and even reduce performance of a semiconductor device thus produced.

SUMMARY OF THE INVENTION

The present invention provides a semiconductor device which comprises a monocrystalline substrate, multiple nucleuses on the monocrystalline substrate, a dislocation inhibition layer on the multiple nucleuses, and an epitaxy layer on the dislocation inhibition layer. The multiple nucleuses are made of at least two materials having different crystal constants. The multiple nucleuses are respectively isolated. Preferably, the multiple nucleuses are 10 Å to 100 Å thick.

DETAILED DESCRIPTION OF THE INVENTION

The present invention provides multiple nucleuses made of at least two materials on a substrate so as to solve problems of the dislocation defects resulted from crystal lattice mismatch between the substrate and an epitaxy layer, particularly between an aluminum oxide (a=4.758 Å) substrate and a GaN (a=3.189 Å) epitaxy layer. The dislocation defects, if not reduced, have a great impact on both the electronic and optical performance of a light emitting semiconductor device.

Figure 1A:
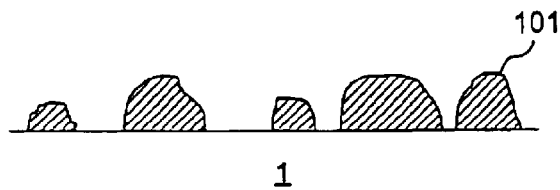
FIGS. 1a to 1d depict in detail dislocation defects occurring in a semiconductor device according to prior art.
Figure 1B:
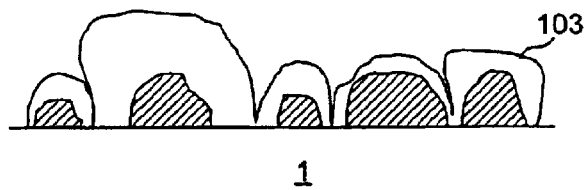
Figure 1C:
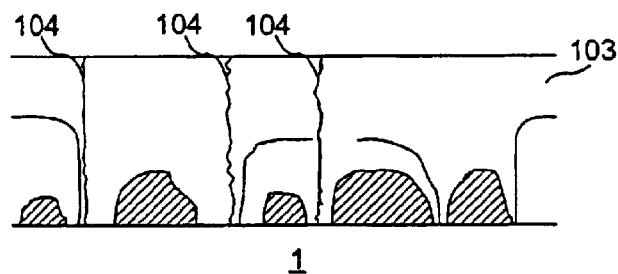
Figure 1D:
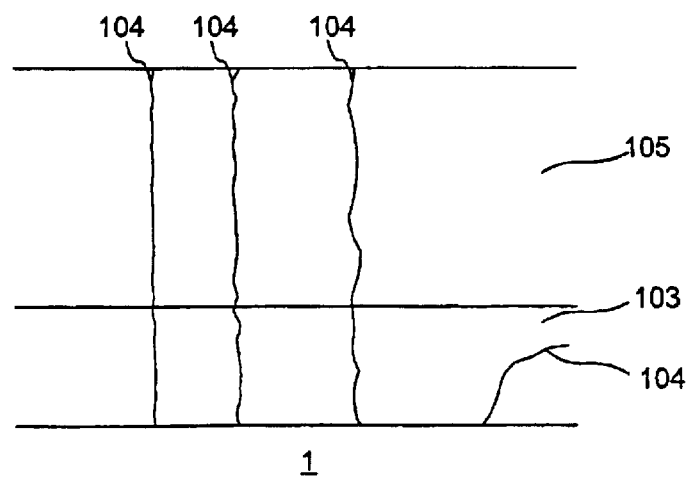
Figure 2A:
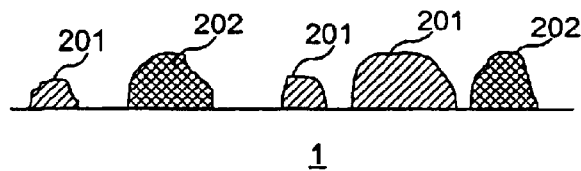
FIGS. 2a to 2d depict in detail less dislocation defects in a semiconductor device according to the present invention.
Figure 2B:
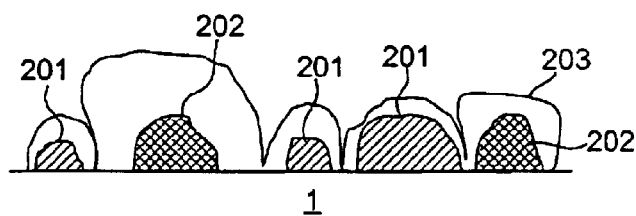
Figure 2C:
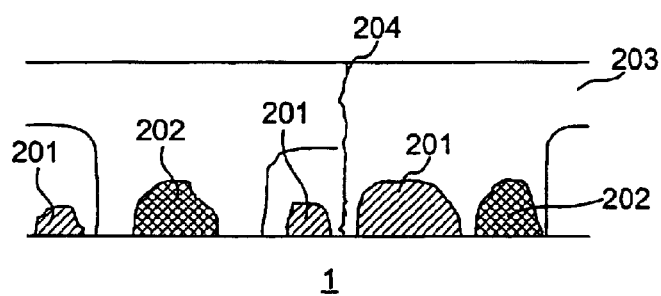
Figure 2D:
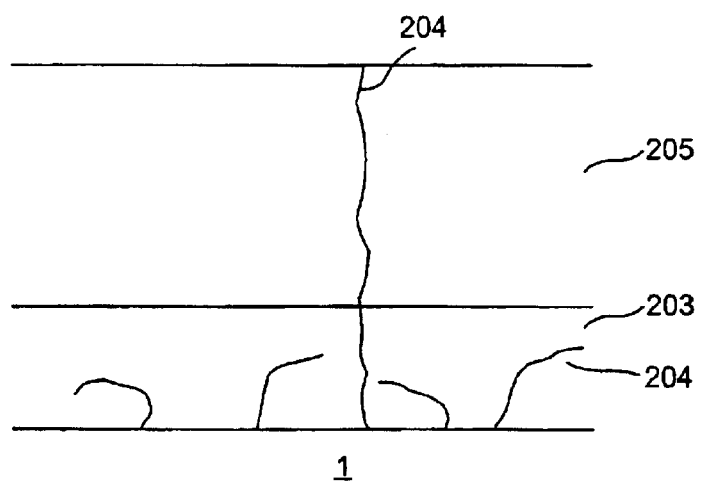

Please refer to FIGS. 2a to 2d in describing how to reduce the dislocation defects according to the present invention. Firstly, please refer to FIG. 2a. On a substrate 1, multiple nucleuses 201 and 202 are grown. The multiple nucleuses 201 and 202 are made of two materials having different lattice constants so as to reduce stress resulted from lattice constant differences between the substrate 1 and an epitaxy layer 205 later grown thereon. The multiple nucleuses 201 and 202 are respectively isolated so as to allow a dislocation inhibition layer 203 to grow. Next, please refer to FIG. 2b. The dislocation inhibition layer 203 is grown on the substrate 1 and the multiple nucleuses 201 and 202. FIG. 2c depict the dislocation inhibition layer 203 after growth completion. Dislocation defects 204 are less produced since sides between the nucleuses 201 and 202 are prohibited from occurring unbearable stress. This is because that epitaxy growth may be implemented in different rates and directions and that the dislocation is either inhibited or forced to grow along lateral sides. After growth of the epitaxy layer 205, which is shown in FIG. 2d, a semiconductor device with less dislocation defects that extend all the way up to the epitaxy layer 205 is produced.

The nucleuses 201 and 202 each preferably has a chemical formula of $Al_xIn_yGa_{1-x-y}N$, wherein $0 \leq x \leq 1$, $0 \leq y \leq 1$, and $0 \leq x+y \leq 1$. Comparatively large lattice constant materials, such as InN (a=3.544 Å) and GaN (a=3.189 Å), are alternately mixed with comparatively less lattice constant materials, such as AlN (a=3.11 Å), so as to constitute the multiple nucleuses 201 and 202. The spaced-apart nucleuses 201 and 202 made of at least two materials reduce dislocation defects by helping to grow the epitaxy layer 205 at different nucleus formation rates and directions.

The dislocation inhibition layer 203 is preferably made of $Al_xIn_yGa_{1-x-y}N$, wherein $0 \leq x \leq 1$, $0 \leq y \leq 1$, and $0 \leq x+y \leq 1$, and more preferably, made of GaN-based material such as GaN, AlN and AlGaN. The dislocation inhibition layer 203 helps to further reduce the dislocation defects between the multiple nucleuses 201 and 202 and the epitaxy layer 205.

Any compound semicondutor layer(s) on the substrate may be grown thereon according to the following methods. A compound semiconductor layer is directly or indirectly formed on the substrate by hydride vapor phase epitaxy (HVPE), organometallic vapor phase epitaxy (OMVPE), or molecular beam epitaxy (MBE). For a III-nitrogen group compound semiconductor, it is an $Al_xIn_yGa_{1-x-y}N$ layer, wherein $0 \leq x \leq 1, 0 \leq y \leq 1$, and $0 \leq x+y \leq 1$. Gallium source is TMGa or TEGa. Aluminum source is TMAl or TEAl. Indium source is TMIn or TEIn. Nitrogen source is $NH_3$ or dimethylhydrazine ($DMeNNH_2$). P-type dopant is selected from the group consisting of Zn, Cd, Be, Mg, Ca, Ba, and Sb. N-type dopant is selected from the group consisting of Si, Ge, and Sn. The p-type and n-type dopants are also applied in the following embodiments.

Figure 3:
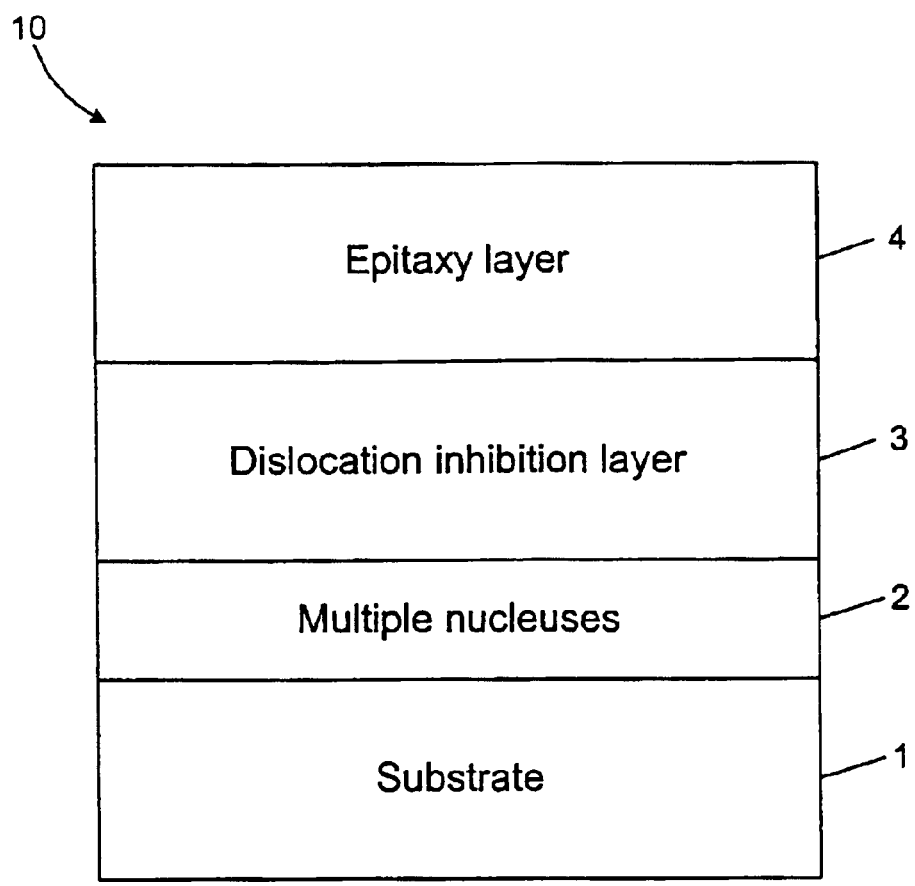
FIG. 3 is a schematic diagram of a semiconductor device according to the present invention.

For simplicity, the multiple nucleuses are shown by layer(s) not in a true scale in the following drawings. Please refer to FIG. 3. On a substrate 1, 10 Å to 100 Å thick multiple nucleuses 2 are grown at a growth temperature of 400° C. to 1000° C. Proper compositions of the multiple nucleuses 2 are determined by manipulating flow rates of gaseous Al, In, and Ga compounds and growth temperatures. A 100 Å to 500 Å thick $Al_xIn_yGa_{1-x-y}N$ ($0 \leq x \leq 1; 0 \leq y \leq 1; 0 \leq x+y \leq 1$) dislocation inhibition layer 3 is grown on the multiple nucleuses 2 at a growth temperature of 400° C. to 1000° C. so as to further reduce dislocation defects. Then a GaN-base compound semiconductor epitaxy layer 4 is grown on the dislocation inhibition layer 3 at a growth temperature of 1000° C. to 1200° C.

The multiple nucleuses 2 are grown to reduce dislocation defects by the following demonstrative ways.

(1) Growing multiple nucleuses 2 on a substrate 1. The growth way is first growing InN nucleuses and then growing AlN nucleuses on the substrate. The InN and AlN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(2) Growing multiple nucleuses 2 on a substrate 1. The growth way is first growing AlN nucleuses and then growing InN nucleuses on the substrate. The AlN and InN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(3) Growing multiple nucleuses 2 on a substrate 1. The growth way is first growing InN nucleuses and then growing GaN nucleuses on the substrate. The InN and GaN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(4) Growing multiple nucleuses 2 on a substrate 1. The growth way is first growing GaN nucleuses and then growing InN nucleuses on the substrate. The GaN and InN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(5) Growing multiple nucleuses 2 on a substrate 1. The growth way is first growing InGaN nucleuses and then growing GaN nucleuses on the substrate. The InGaN and GaN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(6) Growing multiple nucleuses 2 on a substrate 1. The growth way is first growing GaN nucleuses and then growing AlInN nucleuses on the substrate. The GaN and AlInN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(7) Growing multiple nucleuses 2 on a substrate 1. The growth way is first growing AlInN nucleuses and then growing GaN nucleuses on the substrate. The AlInN and GaN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(8) Growing multiple nucleuses 2 on a substrate 1. The growth way is first growing InN nucleuses and then growing AlGaN nucleuses on the substrate. The InN and AlGaN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(9) Growing multiple nucleuses 2 on a substrate 1. The growth way is first growing AlGaN nucleuses and then growing InN nucleuses on the substrate. The AlGaN and InN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(10) Growing multiple nucleuses 2 on a substrate 1. The growth way is first growing AlN nucleuses and then growing InGaN nucleuses on the substrate. The AlN and InGaN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(11) Growing multiple nucleuses 2 on a substrate 1. The growth way is first growing InGaN nucleuses and then growing AlN nucleuses on the substrate. The InGaN and AlN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(12) Growing multiple nucleuses 2 on a substrate 1. The growth way is first growing AlInGaN nucleuses and then growing InGaN nucleuses on the substrate. The AlInGaN and InGaN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

(13) Growing multiple nucleuses 2 on a substrate 1. The growth way is first growing InGaN nucleuses and then growing AlInN nucleuses on the substrate. The InGaN and AlInN nucleuses are about 10 to 100 Å thick. The nucleuses are respectively isolated to preferably have numerous cavities on surface thereof so as to reduce dislocation defects. An $Al_xIn_yGa_{1-x-y}N$ ($0 \leq x \leq 1; 0 \leq y \leq 1; 0 \leq x+y \leq 1$) dislocation inhibition layer 3 is then grown on the multiple nucleuses 2. The dislocation inhibition layer 3 is about 100 Å to 500 Å thick.

Preferred embodiments of the present invention are further described in the following.

EXAMPLE 1

Figure 4:
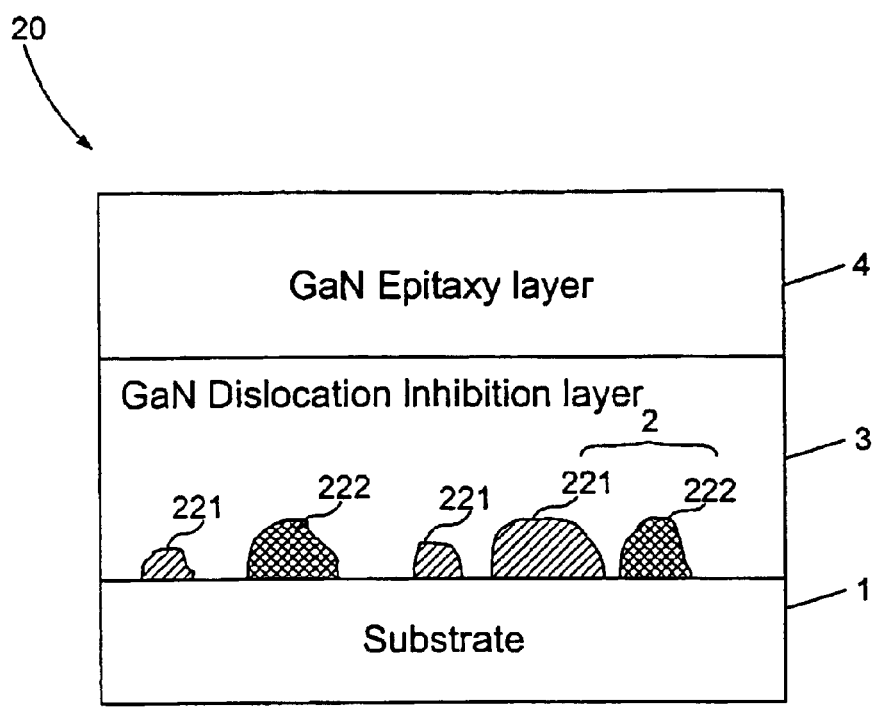
FIG. 4 is a schematic diagram of a semiconductor device according to the first preferred embodiment of the present invention.

Please refer to FIG. 4, which is a schematic diagram of a GaN semiconductor device 20. An epitaxy-ready $Al_2O_3$ substrate 1, ex. a wafer, was first placed in an organometallic vapor phase epitaxy growth reactor (not shown in the figure). The substrate 1 was preheated at 1150° C. and then hydrogen gas at a flow rate of 10 l/min was introduced to clean the wafer surface. The temperature was then lowered to a range between 400° C. and 1000° C., and a mixed gas flow including 55 μmol/min of TMIn and 3 l/min of $NH_3$ was introduced to grow InN nucleuses 221. A preferred growth temperature of the InN nucleuses 221 was 620° C. Next, a mixed gas flow including 50 μmol/min of TMAl and 2 l/min of $NH_3$ was introduced to grow AlN nucleuses 222. A preferred growth temperature of the AlN nucleuses 222 was 530° C. The InN and AlN nucleuses, 221 and 222, were about 45 Å thick. Next, the temperature was lowered to a range between 400° C. and 1000° C., and a mixed gas flow including 30 μmol/min of TMGa and 2.5 l/min of $NH_3$ was introduced to grow a GaN dislocation inhibition layer 3 which was about 100 Å to 500 Å thick. A preferred growth temperature and a preferred thickness of the dislocation inhibition layer 3 were respectively 500° C. and 200 Å. Then, the temperature was raised to 1120° C., and a mixed gas flow including 52 μmol/min of TMGa and 3 l/min of $NH_3$ was introduced to grow a 2 μm thick undoped GaN epitaxy layer 4 on the GaN dislocation inhibition layer 3. The epitaxy layer 4 was measured by the Hall effect measurement. The results showed that mobility was 430 $cm^{-2}$/V-s and carrier concentration was $-3e16/cm^3$ at a temperature of 300K; and that mobility was 1250 $cm^2$/V-s and carrier concentration was $-7.04e15/cm^3$ at a temperature of 77 K.

EXAMPLE 2

Figure 5:
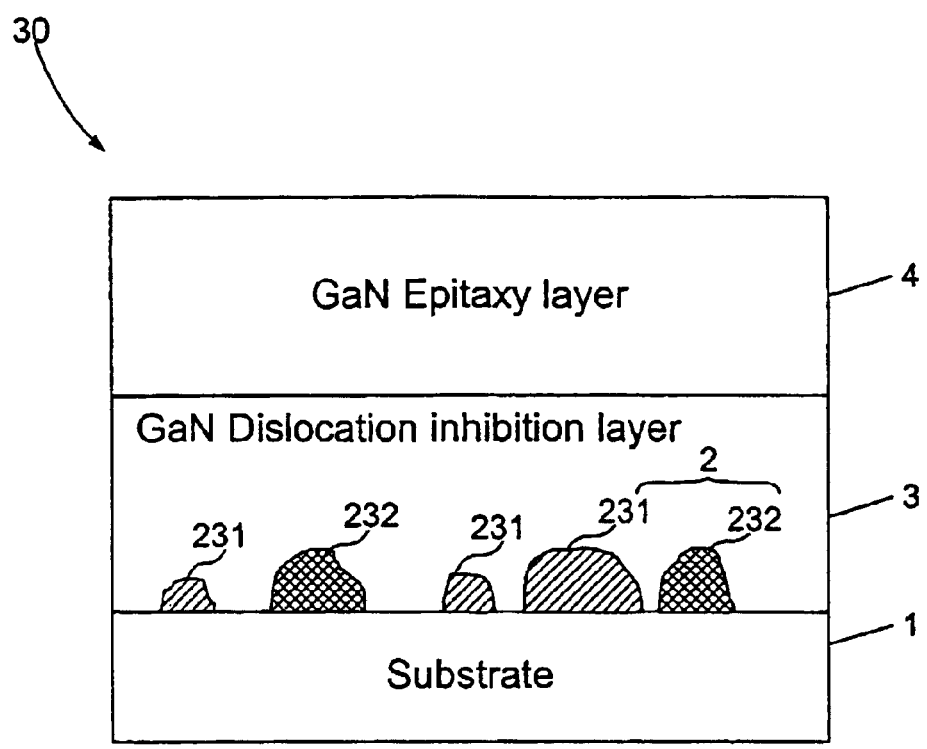
FIG. 5 is a schematic diagram of a semiconductor device according to the second preferred embodiment of the present invention.

Please refer to FIG. 5, which is a schematic diagram of a GaN semiconductor device 30. An epitaxy-ready $Al_2O_3$ substrate 1, ex. a wafer, was first placed in an organometallic vapor phase epitaxy growth reactor (not shown in the figure). The substrate 1 was preheated at 1150° C. and then hydrogen gas at a flow rate of 10 l/min was introduced to clean the wafer surface. The temperature was then lowered to a range between 400° C. and 1000° C., and a mixed gas flow including 50 μmol/min of TMAl and 2 l/min of $NH_3$ was introduced to grow AlN nucleuses 231. A preferred growth temperature of the nucleuses 231 was 530° C. Next, a mixed gas flow including 55 μmol/min of TMIn and 3 l/min of $NH_3$ was introduced to grow InN nucleuses 232. A preferred growth temperature of the nucleuses 232 was 620° C. The multiple nucleusess, 231 and 232, were about 45 Å thick. Next, the temperature was lowered to a range between 400° C. and 1000° C., and a mixed gas flow including 30 μmol/min of TMGa and 2.5 l/min of $NH_3$ was introduced to grow a GaN dislocation inhibition layer 3 which was about 100 Å to 500 Å thick. A preferred growth temperature and a preferred thickness of the dislocation inhibition layer 3 were respectively 500° C. and 200 Å. Then, the temperature was raised to 1120° C., and a mixed gas flow including 52 μmol/min of TMGa and 3 l/mm of $NH_3$ was introduced to grow a 2 μm thick undoped GaN epitaxy layer 4 on the GaN dislocation inhibition layer 3.

EXAMPLE 3

Figure 6:
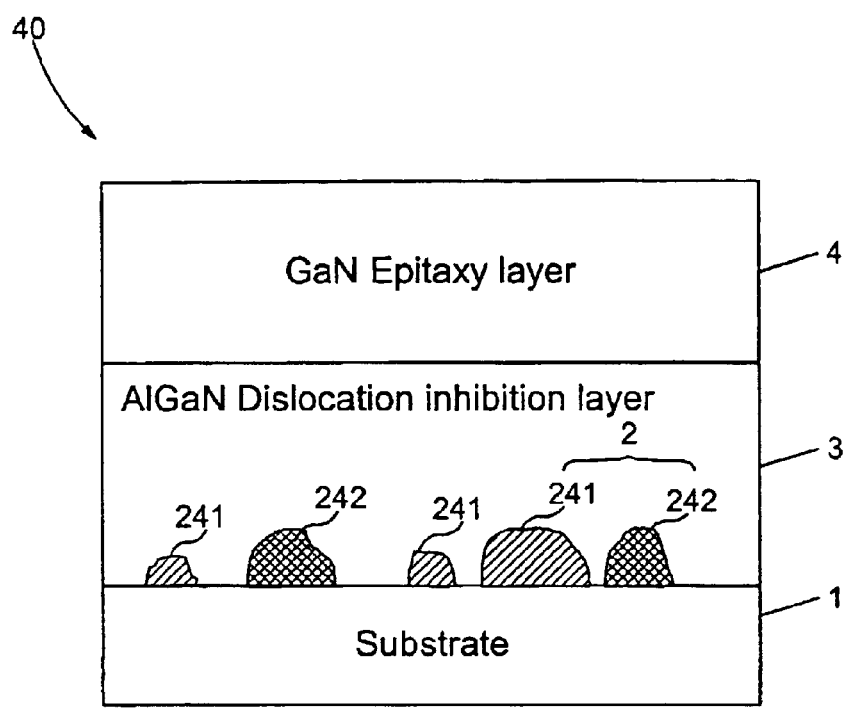
FIG. 6 is a schematic diagram of a semiconductor device according to the third preferred embodiment of the present invention.

Please refer to FIG. 6, which is a schematic diagram of a GaN semiconductor device 40. An epitaxy-ready $Al_2O_3$ substrate 1, ex. a wafer, was first placed in an organometallic vapor phase epitaxy growth reactor (not shown in the figure). The substrate 1 was preheated at 1150° C. and then hydrogen gas at a flow rate of 10 l/min was introduced to clean the wafer surface. The temperature was then lowered to a range between 500° C. and 600° C., and a mixed gas flow including 50 μmol/min of TMGa and 1.5 l/min of $NH_3$ was introduced to grow GaN nucleuses 241. A preferred growth temperature of the nucleuses 241 was 510° C. Then a mixed gas flow including 25 μmol/min of TMA1, 20 μmol/min of TMIn and 2.5 l/min of $NH_3$ was introduced to grow AlInN nucleuses 242. A preferred growth temperature of the nucleuses 242 was 580° C. The multiple nucleuses, 241 and 242, were about 65 Å thick. Next, the temperature was lowered to 500° C., and a mixed gas flow including 30 μmol/min of TMGa, 25 μmol/min of TMA1 and 3 l/min of $NH_3$ was introduced to grow a 200 Å thick AlGaN dislocation inhibition layer 3 on the AlInN nucleuses 2. Then, the temperature was raised to 1120° C., and a mixed gas flow including 52 μmol/min of TMGa and 3 l/min of $NH_3$ was introduced to grow a 2 μm thick undoped GaN epitaxy layer 4 on the AlGaN dislocation inhibition layer 3.

EXAMPLE 4

Figure 7:
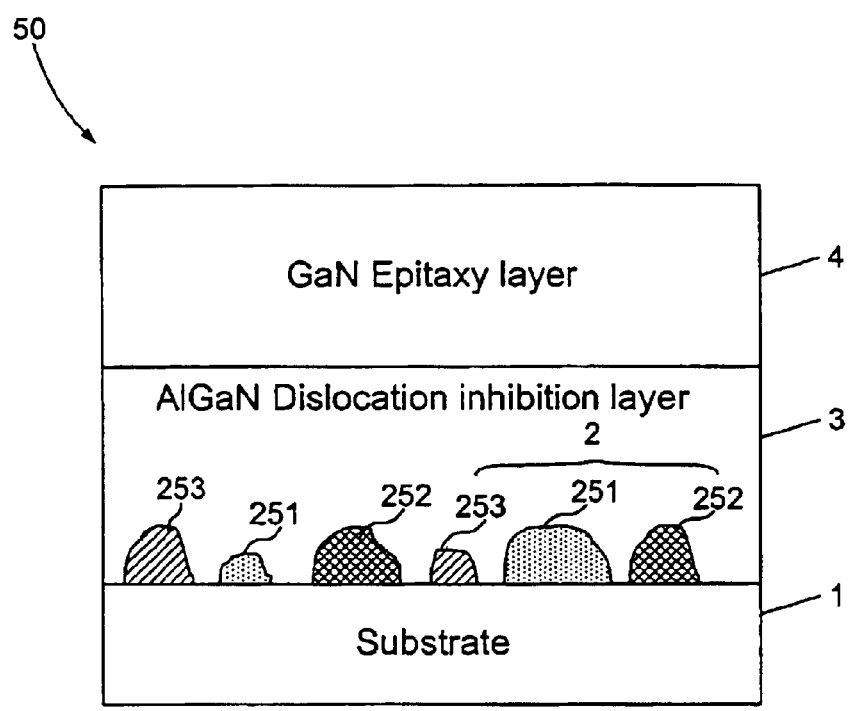
FIG. 7 is a schematic diagram of a semiconductor device according to the fourth preferred embodiment of the present invention.

Please refer to FIG. 7, which is a schematic diagram of a GaN semiconductor device 50. An epitaxy-ready $Al_2O_3$ substrate 1, ex. a wafer, was first placed in an organometallic vapor phase epitaxy growth reactor (not shown in the figure). The substrate 1 was preheated at 1150° C. and then hydrogen gas at a flow rate of 10 l/min was introduced to clean the wafer surface. The temperature was then lowered to a range between 400° C. and 1000° C., and a mixed gas flow including 55 μmol/min of TMIn and 3 l/min of $NH_3$ was introduced to grow InN nucleuses 251. A preferred growth temperature of the nucleuses 251 was 620° C. Next, a mixed gas flow including 50 μmol/min of TMA1 and 2 l/min of $NH_3$ was introduced to grow AlN nucleuses 252. A preferred growth temperature of the nucleuses 252 was 530° C. Next, a mixed gas flow including 55 μmol/min of TMIn and 3 l/min of $NH_3$ was introduced to grow InN nucleuses 253. A preferred growth temperature of the nucleuses 253 was 620° C. The multiple nucleuses, 251, 252 and 253, were about 50 Å thick. Next, the temperature was lowered to a range between 400° C. and 1000° C., and a mixed gas flow including 30 μmol/min of TMGa, 25 μmol/min of TMA1 and 2.5 l/min of $NH_3$ was introduced to grow a AlGaN dislocation inhibition layer 3 which was about 100 Å to 500 Å thick on the multiple nucleuses 2. A preferred growth temperature and a preferred thickness of the dislocation inhibition layer 3 were respectively 500° C. and 200 Å. Then, the temperature was raised to 1120° C., and a mixed gas flow including 52 μmol/min of TMGa and 3 l/min of $NH_3$ was introduced to grow a 2 μm thick undoped GaN epitaxy layer 4 on the AlGaN dislocation inhibition layer 3.

EXAMPLE 5

Figure 8:
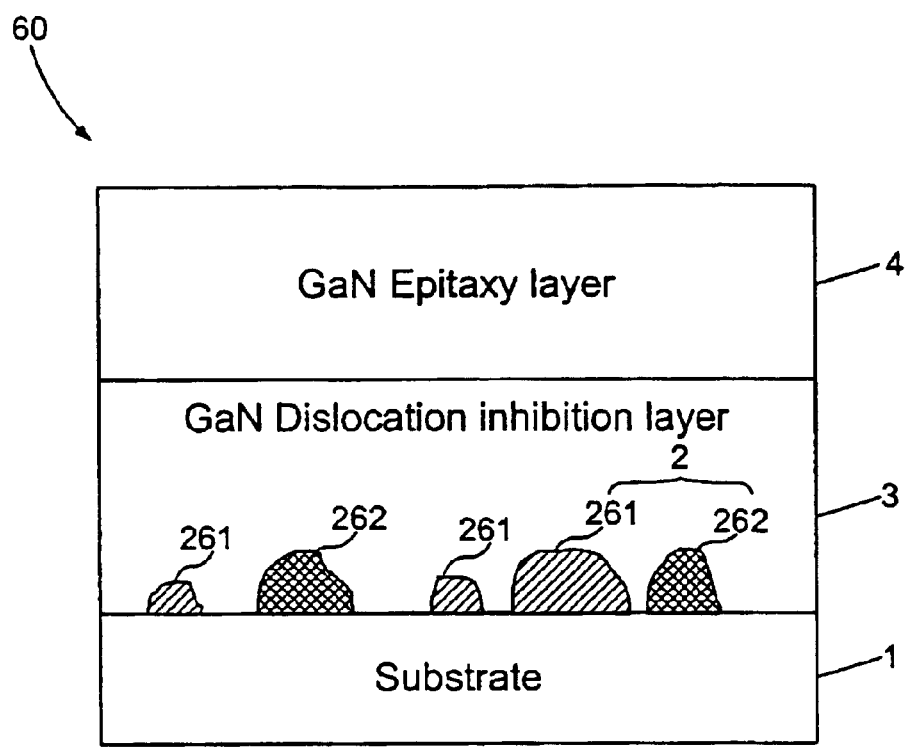
FIG. 8 is a schematic diagram of a semiconductor device according to the fifth preferred embodiment of the present invention.

Please refer to FIG. 8, which is a schematic diagram of a GaN semiconductor device 60. An epitaxy-ready $Al_2O_3$ substrate 1, ex. a wafer, was first placed in an organometallic vapor phase epitaxy growth reactor (not shown in the figure). The substrate 1 was preheated at 1150° C. and then hydrogen gas at a flow rate of 10 l/min was introduced to clean the wafer surface. The temperature was then lowered to a range between 500° C. and 600° C. When the temperature reached 500° C., a mixed gas flow including 30 μmol/min of TMGa, 25 μmol/min of TMA1 and 3 l/min of $NH_3$ was introduced to grow AlGaN nucleuses 261. Next, the temperature was adjusted to 580° C. and a mixed gas flow including 25 μmol/min of TMA1, 20 μmol/min of TMIn and 2.5 l/min of $NH_3$ was introduced to grow AlInN nucleuses 262. The multiple nucleusess, 261 and 262, were about 65 Å thick. Next, the temperature was adjusted to a range between 400° C. and 1000° C., and a mixed gas flow including 30 μmol/min of TMGa and 2 l/min of $NH_3$ was introduced to grow a 200 Å thick GaN dislocation inhibition layer 3 on the multiple nucleuses 2. Then, the temperature was raised to 1120° C., and a mixed gas flow including 52 μmol/min of TMGa and 3 l/min of $NH_3$ was introduced to grow a 2 μm in thick undoped GaN epitaxy layer 4 on the GaN dislocation inhibition layer 3.

EXAMPLE 6

Figure 9:
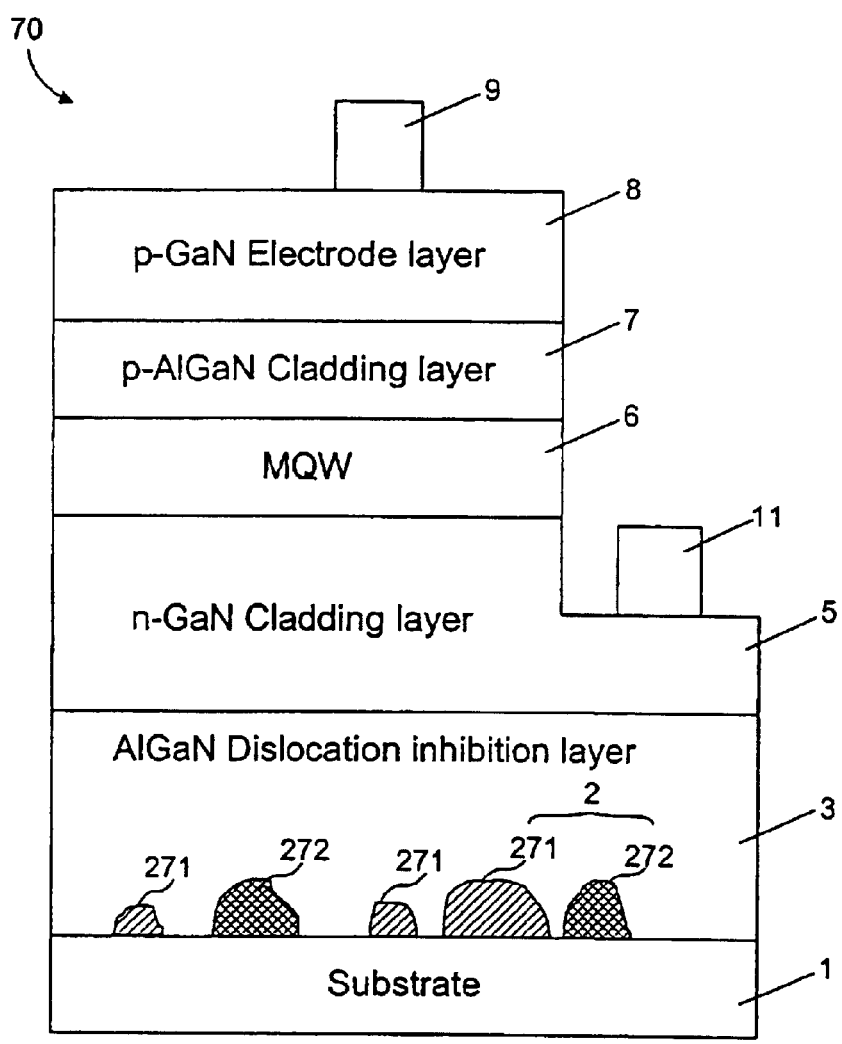
FIG. 9 is a schematic diagram of a light emitting semiconductor device according to the sixth preferred embodiment of the present invention.

Please refer to FIG. 9, which is a schematic diagram of a light emitting semiconductor device 70. The light emitting semiconductor device 70 is, for example, a light emitting diode (LED). An epitaxy-ready $Al_2O_3$ substrate 1, ex. a wafer, was first placed in an organometallic vapor phase epitaxy growth reactor (not shown in the figure). The substrate 1 can be made of aluminum oxide, silicon carbide or gallium arsenide. At 1150° C., 5 l/min of hydrogen gas was introduced to clean the wafer surface for ten minutes. The temperature was then lowered to a range between 400° C. and 1000° C., and a mixed gas flow including 50 μmol/min of TMA1 and 2 l/min of $NH_3$ was introduced to grow AlN nucleuses 271. A preferred growth temperature of the nucleuses 271 was 530° C. Next, a mixed gas flow including 55 μmol/min of TMIn and 3 l/min of $NH_3$ was introduced to grow InN nucleuses 272. A preferred growth temperature of the nucleuses 272 was 620° C. The multiple nucleusess, 271 and 272, were about 45 Å thick. Next, the temperature was adjusted to a range between 400° C. and 1000° C., and a mixed gas flow including 20 μmol/min of TMGa, 25 μmol/min of TMA1 and 2.5 l/min of $NH_3$ was introduced to grow a AlGaN dislocation inhibition layer 3 ($Al_yGa_{1-y}N$, $0 \leq y \leq 1$) which was about 100 Å to 500 Å thick on the multiple nucleuses 2. A preferred growth temperature and a preferred thickness of the dislocation inhibition layer 3 were respectively 570° C. and 320 Å. Then, the temperature was raised to 1130° C., and a mixed gas flow including 52 μmol/min of TMGa and 3.5 l/min of $NH_3$ and 100 ppm of $SiH_4/H_2$ was introduced to grow a 4 μm thick n-type GaN cladding layer 5 on the dislocation inhibition layer 3. An embodiment of the cladding layer 5 was $Al_wIn_zGa_{1-w-z}N$, wherein $0 \leq w \leq 1$, $0 \leq z \leq 1$, and $0 \leq w+z \leq 1$.

The temperature was then adjusted to about 850° C., and a mixed gas flow including 30 μmol/min of TMGa, 30 μmol/min of TMIn and 3.5 l/min of $NH_3$ was introduced. By manipulating TMIn output, a multiple quantum well (MQW) layer 6, acting as a light emitting active layer, which includes multiple pairs, ex. 5 pairs, of InGaN/GaN was formed on the n-type GaN cladding layer 5. Next, the temperature was raised to about 1100° C., and a mixed gas flow including 42 μmol/min of TMGa, 20 μmol/min of TMA1, 3.5 l/min of $NH_3$ and 52 nmol/min of DCpMg was introduced to grow a 0.2 μm thick p-type AlGaN cladding layer 7 on the MQW layer 6. An embodiment of the cladding layer 7 was $Al_sIn_tGa_{1-s-t}N$, wherein $0 \leq s \leq 1$, $0 \leq t \leq 1$, and $0 \leq s+t \leq 1$.

The temperature was then raised to about 1130° C., and a mixed gas flow including 52 μmol/min of TMGa, 3.5 l/min of $NH_3$ and 52 nmol/min of DCpMg was introduced to grow a 0.3 μm thick p-type GaN electrode layer 8 on the p-type AlGaN cladding layer 7. An embodiment of the electrode layer 8 was $Al_uIn_vGa_{1-u-v}N$, wherein $0 \leq u \leq 1$, $0 \leq v \leq 1$, and $0 \leq u+v \leq 1$. A LED structure epitaxy wafer was thus finished.

The epitaxy wafer was activated and then produced into chips according to the following steps.

Step 1: removing a portion of the p-type electrode layer 8, p-type cladding layer 7, and MQW layer 6 to expose the surface of the n-type GaN cladding layer 5.

Step 2: depositing a Ni/Au ohmic contact metal layer 9 on the p-type GaN electrode layer 8.

Step 3: depositing a Ti/Al ohmic contact metal layer 11 on the n-type GaN cladding layer 5.

Step 4: Sawing and cutting the wafer into a plurality of 350 μm×350 μm squared chips.

Each of the above LED chips had a forward voltage of 3.5 volts at 20 mA.

EXAMPLE 7

Figure 10:
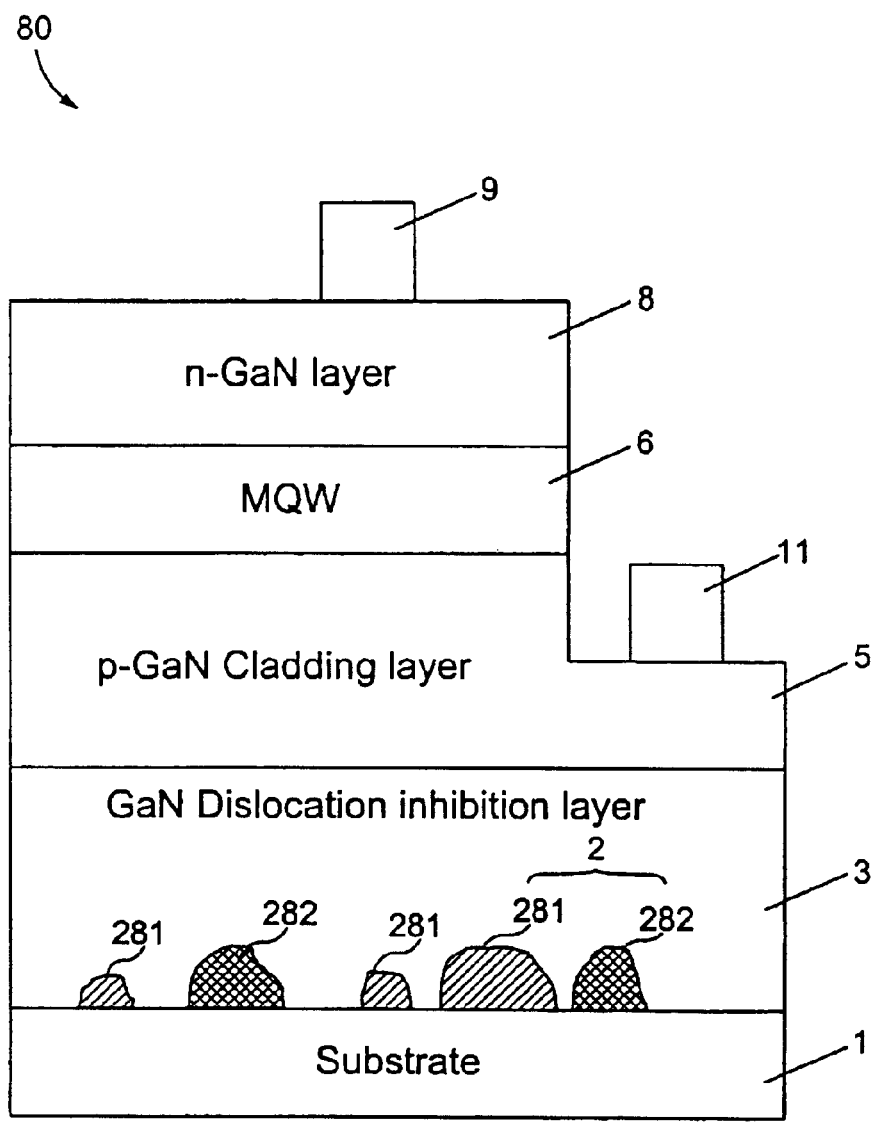
FIG. 10 is a schematic diagram of a light emitting semiconductor device according to the seventh preferred embodiment of the present invention.

Please refer to FIG. 10, which is a schematic diagram of a light emitting semiconductor device 80. The light emitting semiconductor device 80 is, for example, a light emitting diode (LED). An epitaxy-ready $Al_2O_3$ substrate 1, ex. a wafer, was first placed in an organometallic vapor phase epitaxy growth reactor (not shown in the figure). The substrate 1 can be made of aluminum oxide, silicon carbide or gallium arsenide. At 1150° C., 5 l/min of hydrogen gas was introduced to clean the wafer surface for ten minutes. The temperature was then lowered to a range between 400° C. and 1000° C., and a mixed gas flow including 25 μmol/min of TMIn and 3 l/min of $NH_3$ was introduced to grow InN nucleuses 281. A preferred growth temperature of the nucleuses 281 was 620° C. Next, a mixed gas flow including 45 μmol/min of TMGa, 35 μmol/min of TMA1 and 3 l/min of $NH_3$ was introduced to grow AlGaN nucleuses 282. A preferred growth temperature of the nucleuses 282 was 550° C. The multiple nucleuses, 281 and 282, were about 60 Å thick. Next, the temperature was adjusted to a range between 400° C. and 1000° C., and a mixed gas flow including 35 μmol/min of TMGa and 2.5 l/min of $NH_3$ was introduced to grow a GaN dislocation inhibition layer 3 ($Al_yGa_{1-y}N$, $0 \leq y \leq 1$) which was about 100 Å to 500 Å thick on the multiple nucleuses 2. A preferred growth temperature and a preferred thickness of the dislocation inhibition layer 3 were respectively 510° C. and 250 Å. Then, the temperature was raised to 1130° C., and a mixed gas flow including 52 μmol/min of TMGa and 3.5 l/min of $NH_3$ and 52 nmol/min of DCpMg was introduced to grow a 4 μm thick p-type GaN cladding layer 5 on the dislocation inhibition layer 3. An embodiment of the cladding layer 5 was $Al_wIn_zGa_{1-w-z}N$, wherein $0 \leq w \leq 1$, $0 \leq z \leq 1$, and $0 \leq w+z \leq 1$.

The temperature was then reduced to about 850° C., and a mixed gas flow including 30 μmol/min of TMGa, 30 μmol/min of TMIn and 3.5 l/min of $NH_3$ was introduced. By manipulating TMIn output, a multiple quantum well (MQW) layer 6, acting as a light emitting active layer, which includes multiple pairs, ex. 5 pairs, of InGaN/GaN was formed on the p-type GaN cladding layer 5. Next, the temperature was raised to about 1130° C., and a mixed gas flow including 52 μmol/min of TMGa, 3.5 l/min of $NH_3$ and 100 ppm of $SiH_4/H_2$ was introduced to grow a 0.5 μm thick n-type GaN layer 8 on the MQW layer 6. The n-type GaN layer 8 served both as a cladding layer of the MQW layer 6 and an electrode layer of the LED 80. A LED structure epitaxy wafer was thus finished.

The epitaxy wafer was activated and then produced into chips according to the following steps.

Step 1: removing a portion of the n-type GaN layer 8 and MQW layer 6 to expose the surface of the p-type GaN cladding layer 5.

Step 2: depositing a Ni/Au ohmic contact metal layer 11 on the p-type GaN cladding layer 5.

Step 3: depositing a Ti/Al ohmic contact metal layer 9 on the n-type GaN layer 8.

Step 4: Sawing and cutting the wafer into a plurality of 350 μm×350 μm squared chips.

Each of the above LED chips had a forward voltage of 3.5 volts at 20 mA.

EXAMPLE 8

Figure 11:
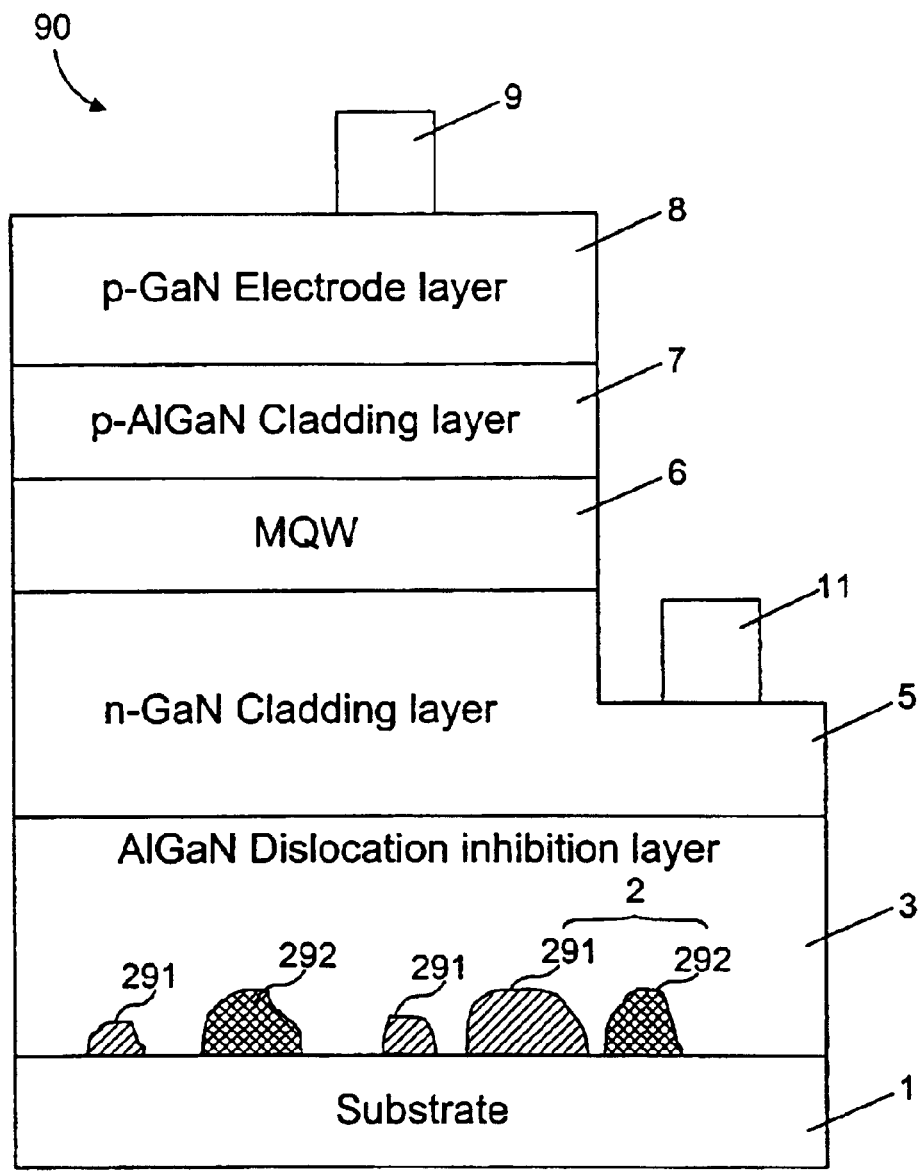
FIG. 11 is a schematic diagram of a light emitting semiconductor device according to the eighth preferred embodiment of the present invention.

Please refer to FIG. 11, which is a schematic diagram of a light emitting semiconductor device 90. The light emitting semiconductor device 90 is, for example, a light emitting diode (LED). An epitaxy-ready $Al_2O_3$ substrate 1, ex. a wafer, was first placed in an organometallic vapor phase epitaxy growth reactor (not shown in the figure). The substrate 1 can be made of aluminum oxide, silicon carbide or gallium arsenide. At 1150° C., 5 l/mm of hydrogen gas was introduced to clean the wafer surface for ten minutes. The temperature was then lowered to a range between 400° C. and 1000° C., and a mixed gas flow including 45 μmol/min of TMGa, 40 μmol/min of TMIn and 3 l/min of $NH_3$ was introduced to grow InGaN nucleuses 291. A preferred growth temperature of the nucleuses 291 was 570° C. Next, a mixed gas flow including 50 μmol/min of TMA1, 40 μmol/min of TMIn and 3 l/min of $NH_3$ was introduced to grow AlInN nucleuses 292. A preferred growth temperature of the nucleuses 292 was 570° C. The multiple nucleusess, 291 and 292, were about 50 Å thick. Next, the temperature was adjusted to a range between 400° C. and 1000° C., and a mixed gas flow including 20 μmol/min of TMGa, 25 μmol/min of TMA1 and 2.5 l/mm of $NH_3$ was introduced to grow a AlGaN dislocation inhibition layer 3 which was about 100 Å to 500 Å thick on the multiple nuceuses 2. A preferred growth temperature and a preferred thickness of the dislocation inhibition layer 3 were respectively 550° C. and 320 Å. Then, the temperature was raised to 1130° C., and a mixed gas flow including 52 μmol/min of TMGa and 3.5 l/min of $NH_3$ and 100 ppm of $SiH_4/H_2$ was introduced to grow a 4 μm thick n-type GaN cladding layer 5 on the dislocation inhibition layer 3.

The temperature was then adjusted to about 850° C., and a mixed gas flow including 30 μmol/min of TMGa, 30 μmol/min of TMIn and 3.5 l/min of $NH_3$ was introduced. By manipulating TMIn output, a multiple quantum well (MQW) layer 6, acting as a light emitting active layer, which includes multiple pairs, ex. 5 pairs, of InGaN/GaN was formed on the n-type GaN cladding layer 5. Next, the temperature was raised to about 1100° C., and a mixed gas flow including 42 μmol/min of TMGa, 20 μmol/min of TMA1, 3.5 l/min of $NH_3$ and 52 nmol/min of DCpMg was introduced to grow a 0.2 μm thick p-type AlGaN cladding layer 7 on the MQW layer 6.

The temperature was then raised to about 1130° C., and a mixed gas flow including 52 μmol/min of TMGa, 3.5 l/min of $NH_3$ and 52 nmol/min of DCpMg was introduced to grow a 0.3 μm thick p-type GaN electrode layer 8 on the p-type AlGaN cladding layer 7. A LED structure epitaxy wafer was thus finished.

The epitaxy wafer was activated and then produced into chips according to the following steps.

Step 1: removing a portion of the p-type electrode layer 8, p-type cladding layer 7, and MQW layer 6 to expose the surface of the n-type GaN cladding layer 5.

Step 2: depositing a Ni/Au ohmic contact metal layer 9 on the p-type GaN electrode layer 8.

Step 3: depositing a Ti/Al ohmic contact metal layer 11 on the n-type GaN cladding layer 5.

Step 4: Sawing and cutting the wafer into a plurality of 350 μm×350 μm squared chips.

Each of the above LED chips had a forward voltage of 3.5 volts at 20 mA.

The above descriptions are preferred embodiments of the invention. Equivalent changes and modifications within the scope of the invention are covered by the present invention.

What is claimed:

1. A semiconductor device, comprising:
   a monocrystalline substrate;
   multiple nucleuses being made of at least two materials having different crystal lattice constants, the multiple nucleuses being directly formed on the monocrystalline substrate and spaced apart from each other;
   a dislocation inhibition layer over the multiple nucleuses; and
   an epitaxy layer on the dislocation inhibition layer.

2. The semiconductor device of claim 1, wherein the multiple nucleuses are 10 Å to 100 Å thick.

3. The semiconductor device of claim 1, wherein the at least two materials are respectively selected from AlN, InN, GaN, AlInN, AlGaN, InGaN and AlGaInN.

4. The semiconductor device of claim 1, wherein the multiple nucleuses are grown at a temperature between 400° C. and 1000° C.

5. The semiconductor device of claim 1, wherein the dislocation inhibition layer is made of $Al_xIn_yGa_{1-x-y}N$, $0 \leq x \leq 1$, $0 \leq y \leq 1$, and $0 \leq x+y \leq 1$.

6. The semiconductor device of claim 1, wherein the monocrystalline substrate is selectively made of aluminum oxide, silicon carbide and gallium arsenide.

7. The semiconductor device of claim 1, wherein the epitaxy layer is a GaN layer.

* * * * *